United States Patent [19]

Krautschneider et al.

[11] Patent Number: 5,327,374
[45] Date of Patent: Jul. 5, 1994

[54] ARRANGEMENT WITH SELF-AMPLIFYING DYNAMIC MOS TRANSISTOR STORAGE CELLS

[75] Inventors: Wolfgang Krautschneider, Ottbrunn; Klaus Lau, Vagen; Lothar Risch, Neubiberg, all of Fed. Rep. of Germany

[73] Assignee: Siemens Aktiengesellschaft, Munich, Fed. Rep. of Germany

[21] Appl. No.: 956,896

[22] PCT Filed: Jul. 18, 1991

[86] PCT No.: PCT/DE91/00502
§ 371 Date: Dec. 29, 1992
§ 102(e) Date: Dec. 29, 1992

[87] PCT Pub. No.: WO92/01287
PCT Pub. Date: Jan. 23, 1992

[30] Foreign Application Priority Data

Jul. 3, 1990 [DE] Fed. Rep. of Germany ....... 4021127

[51] Int. Cl.$^5$ ............................ G11C 7/06; G11C 7/00
[52] U.S. Cl. .................................... 365/145; 365/185; 257/301; 257/302; 257/304; 257/300
[58] Field of Search ............... 365/145, 185; 257/301, 257/302, 300, 304

[56] References Cited

U.S. PATENT DOCUMENTS

| 4,835,741 | 5/1989 | Baglee | 365/185 |
| 4,964,080 | 10/1990 | Tzeng | 365/185 |
| 4,990,979 | 2/1991 | Otto | 365/185 |

Primary Examiner—Eugene R. LaRoche
Assistant Examiner—Viet Q. Nguyen
Attorney, Agent, or Firm—Hill, Steadman & Simpson

[57] ABSTRACT

An arrangement with self-amplifying dynamic MOS transistor storage cells has in each case a MOS selection transistor AT, whose gate is connected to a word line WL, and an MOS storage transistor ST at whose gate a capacitor C for charge storage acts. This self-amplifying storage cell can be written on and read out with only one bit line BL and one word line WL. The two transistors AT and ST are connected in series and a common drain source region DS is connected via a voltage-dependent resistor VR to the gate electrode GST of the control transistor. The advantages reside in the fact that the cell geometry can be scaled without at the same time the quantity Q of charge which can be read out on the bit line BL having to be reduced, in that the quantity Q of charge which can be read out is larger than a charge stored in the capacitor C which acts at the gate of the storage transistor ST and in that the two MOS transistors AT and ST can be produced relatively simply.

7 Claims, 2 Drawing Sheets

ARRANGEMENT WITH SELF-AMPLIFYING DYNAMIC MOS TRANSISTOR STORAGE CELLS

BACKGROUND OF THE INVENTION

The invention relates to an arrangement with self-amplifying dynamic MOS transistor storage cells as claimed in the preamble of patent claim 1.

An arrangement of self-amplifying dynamic MOS transistor storage cells of this kind is disclosed in the publication with the title ΘNew Dynamic RAM Cell for VLSI Memories" by T. Tsuchiya and M. Itsumi in IEEE Electron. Device Letters, Vol. EDL-3, No. 1, January 1982 (pages 7 to 10). This is a storage cell with two write lines and one read line which is composed of a MOS-FET, a MOS capacitor and a junction FET.

SUMMARY OF THE INVENTION

The invention is based on the object of disclosing an arrangement with self-amplifying dynamic MOS transistor storage cells of the type mentioned at the beginning which is of simple design, permits short access times, has a low degree of sensitivity to impacts by alpha particles and, above all, whose cell geometry can be scaled without the amount of charge which can be read out onto the bit line being substantially reduced. The object is achieved by a multiplicity of MOS transistor storage cells which are in an electrically-conductive manner connected to only one bit line in each case, which in each case have one selection transistor whose gate terminal is in an electrically conductive manner connected to a word line. Each have one storage transistor at whose gate terminal a capacitor acts in order to store information in the form of electrical charge and each MOS transistor storage cell is in an electrically conductive manner connected only to a single word line. Both the selection transistor and the storage transistor are composed in each case of a MOS transistor wherein a second terminal of the selection transistor is in an electrically conductive manner connected in each case to the bit line. The third terminal of the selection transistor and a second terminal of a storage transistor form a common drain-source node. The third terminal of the storage transistor is in an electrically conductive manner connected to a supply voltage, and one voltage-dependent resistor connects the common drain-source node tot he gate terminal of the storage transistor and a capacitor, which acts at the terminal, in such a way that the low resistance value occurs during charging and a high resistance value occurs during charging of the capacitor.

The advantage which can be achieved with the invention resides in particular in the fact that in the arrangement constructed according to the invention with self-amplifying dynamic MOS transistor storage cells, a better charge storage behavior is possible than in the storage cell cited at the beginning by virtue of higher capacitance values with the same space requirement and lower leakage current losses. Further advantages are that the MOS transistor is easy to manufacture in comparison with the junction FET and has a lower soft-error rate due to the lower degree of sensitivity to alpha beams by virtue of a smaller sensitive surface in comparison with the cell surface.

The arrangement with self-amplifying dynamic MOS transistor storage cells having voltage-dependent resistors which are formed by the gate electrode of the storage transistor and the common drain-storage region of the two transistors being composed of semiconductor materials of the same conductance type. The gate electrode of the storage transistor has a higher doping concentration than the drain-source region.

In addition, the storage transistor and the common drain-source region of the two transistors may be composed of semiconductor materials of the same conductance type with the gate electrode of the storage transistor having, however, a higher doping concentration than the common drain-source region, and wherein a metallic layer forms together with the gate electrode of the storage transistor a Schottky diode which has a lower resistance during the charging of the capacitor which acts at the gate of the storage transistor than during the discharging of this capacitor.

In another embodiment, the gate electrode of the storage transistor and the common drain-source region of the two transistors may be composed of highly doped semiconductor materials of the same conductance type with a highly doped region of a conductance type which is different from the gate electrode and drain-source region which is inserted between the gate electrode and the drain-source region in order to produce a voltage-dependent resistor which has a lower resistance during the charging of the capacitor which acts as a gate of the storage transistor than during the discharging of the capacitor.

The selection transistor and the storage transistor may be of planar construction or, in the alternative, the selection transistor may be of planar construction and the storage transistor located in a trench making it possible to feed in the supply voltage directly via a substrate. Finally, the selection transistor and the storage transistor may be located in the same trench with the gate electrode of the storage transistor being insulated from a gate electrode of the selection transistor by an intermediate oxide.

Additional features and advantages of the present invention are described, and will be apparent from, the detailed description of the presently preferred embodiment and from the drawings.

BRIEF DESCRIPTION OF THE DRAWINGS

The invention is explained in greater detail below with reference to the drawings in which.

DETAILED DESCRIPTION OF THE PREFERRED EMBODIMENT

Figure 1:
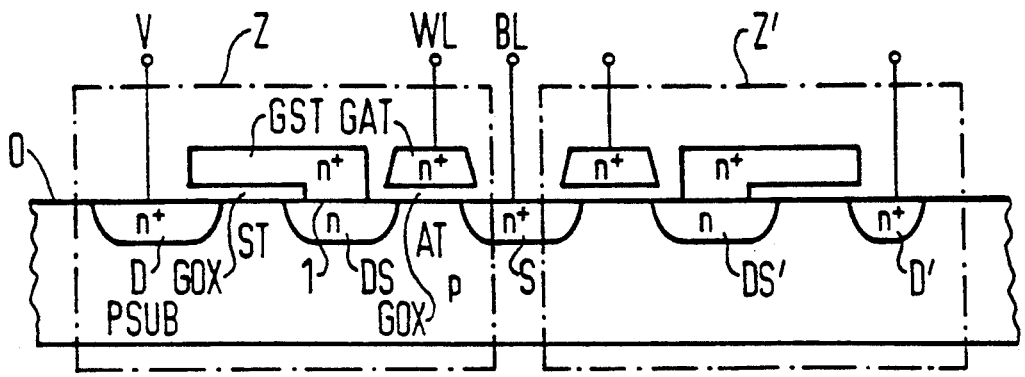
FIG. 1 shows a sectional view of two adjacent MOS transistor storage cells of a storage cell arrangement according to the invention with transistors of planar construction, having in each case an n+n-type junction as a voltage-dependent resistor.

The sectional view in FIG. 1 shows a preferred embodiment of two adjacent MOS transistor storage cells Z and Z' according to the invention. The cells Z and Z' have a p-type doped substrate PSUB which is composed forp example of silicon and is at reference potential. n+-type doped drain regions D and D', n-type doped drain-Source regions DS and DS' and an n+-type doped source region S common to the two storage cells Z and Z' are placed in this substrate PSUB from a surface O of the substrate PSUB. The common source region S is connected to a bit line BL which is common to the two storage cells Z and Z'. Since the storage cells Z and Z' are completely symmetrical, the statements made with reference to Z also correspondingly apply below to Z'. The source region S which is common to the two storage cells Z and Z', the drain-source region DS and the substrate PSUB located between the two regions S and DS, together with an n+-type doped gate electrode GAT which is separated from the substrate PSUB by a thin gate oxide GOX, form a selection transistor AT. The drain-source region DS constitutes the drain region of the selection transistor AT and at the same time forms the source region of the storage transistor ST. The storage transistor ST is formed from the drain-source region DS, a drain region D and a substrate PSUB, lying between them, together with an n+-type doped gate electrode GST of the control transistor ST separated from the substrate PSUB by the thin gate oxide GOX. The drain region D is connected to a supply voltage line V so as to be electrically conducting and the gate electrode GAT of the selection transistor AT is connected to a word line WL so as to be electrically conducting. The gate electrode GST of the control transistor ST and the drain-source region DS are in contact and form an n+n-type junction 1.

Figure 2:
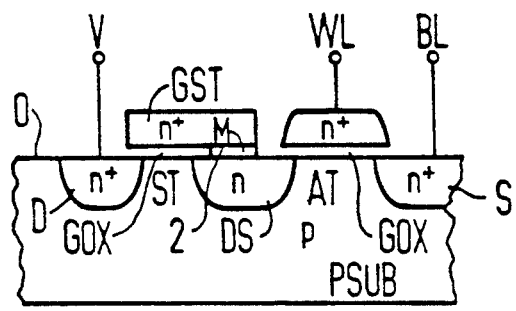
FIG. 2 shows a sectional view of an MOS transistor storage cell of a storage cell arrangement according to the invention having transistors which are of planar design and have a Schottky junction as a voltage-dependent resistor.

FIG. 2 shows a preferred embodiment of a storage cell Z of an arrangement according to the invention of storage cells with transistors of planar design, the storage cells here differing with respect to the storage cells shown in FIG. 1 in that the gate electrode GST of the storage transistor ST is connected to the drain-source region DS with the aid of a Schottky junction 2. The Schottky junction 2 is formed here by the n+-type doped gate electrode GST and a metal film M.

Figure 3:
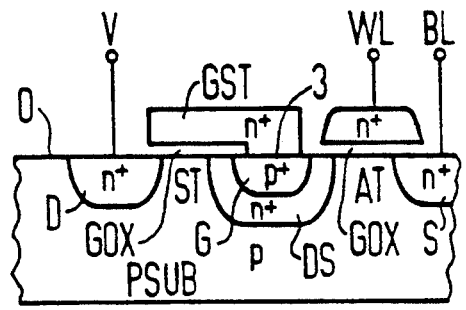
FIG. 3 shows a sectional view of an MOS transistor storage cell of a storage cell arrangement according to the invention having transistors which are of planar design and have an n+p+-type junction as voltage-dependent resistor.

In FIG. 3, as in FIGS. 1 and 2, a preferred embodiment of an MOS transistor storage cell of an arrangement according to the invention of storage cells with transistors of planar design is illustrated, in which however a polycrystalline or polycrystalline-siliconized n+-type gate electrode GST joins a p+-type region G in order to form a voltage-dependent resistor by means of an n+p+-type junction 3. A sufficiently highly doped p+n+-type junction produces here an ohmic contact to the source-drain region DS.

Figure 4:
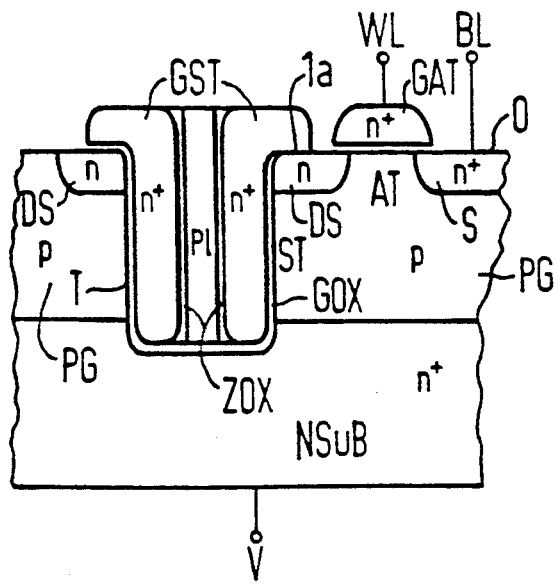
FIG. 4 shows a sectional view of an MOS transistor storage cell of a storage cell arrangement according to the invention having a planar selection transistor and a storage transistor of a trench design.

A different preferred embodiment of the MOS storage cell of an arrangement according to the invention with storage cells has, as shown in FIG. 4, a selection transistor AT of planar construction and a storage transistor ST of a trench design. Here, in an n-type doped substrate NUSB there is a p-type doped region PG which is at reference potential and in which an n-type doped drain-source region DS and an n+-type doped source region S are brought from the surface 0. As for example in FIG. 1, a planar selection transistor AT is formed by an n-type doped drain-source region DS, a common n+-type doped source region S and the intermediate p-type doped region PG together with an n+-type doped gate electrode GAT, separated from the substrate NUSB by a thin gate oxide GOX, of the selection transistor AT. The source region S is connected to a bit line BL and the gate electrode GAT of the selection transistor AT is connected to a word line WL. A trench T is etched into the substrate NSUB and is somewhat deeper than the p-type doped region PG. The n-type doped substrate NSUB is connected in this case to the supply voltage line V so that in order to contact the cells only the bit lines and word lines BL and WL arranged in matrix shape are necessary on the surface of the chip. An n+-type doped gate electrode GST of the control transistor ST is for the most part laid in the trench T, the gate region GST being separated from the substrate NSUB by a thin gate oxide GOX and lining the trench T. Inside the lined trench there is an electrically conductive region P1 (plate), for example made of polycrystalline silicon, for the purpose of increasing the capacitance C which acts at the gate of the storage transistor ST, said region P1 being insulated from the gate region GST by an intermediate oxide ZOX and being for example at a potential of $V_{DD}/2$. The gate electrode GST of the control transistor ST and the drain-source region DS are in contact and thus form an n+n-type junction 1a.

Figure 5:
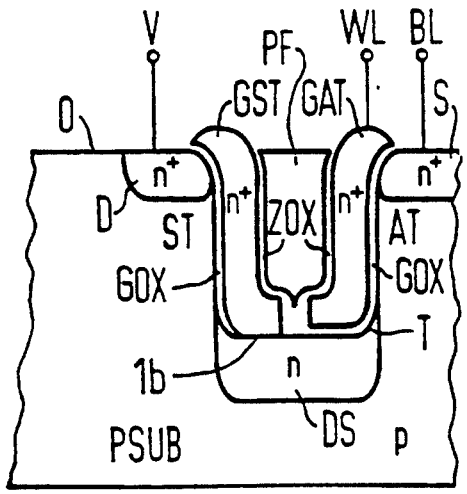
FIG. 5 shows a sectional view of an MOS transistor storage cell of a storage cell arrangement according to the invention having a selection transistor and a storage transistor of a trench design.

In the preferred embodiment of an MOS transistor storage cell, shown in FIG. 5, of an arrangement of storage cells according to the invention, both a selection transistor AT and a control transistor ST are realized in a trench design. For this purpose, an n+-type doped common source region S and an n+-type doped drain region D are brought from the surface O into a p-type doped substrate PSUB and extend in each case as far as the edge of the trench T. An n-type doped drain-source region DS is located directly below the trench T which is lined by a thin gate oxide GOX except for an n+n-type junction 1b between the gate electrode GST of the storage transistor ST and the drain-source region DS. In the trench T lined by the thin gate oxide there is also the gate electrode GAT of the selection transistor AT, said electrode being insulated from the gate electrode GST. The gate electrode GAT of the selection transistor AT is connected to a word line WL and, like the gate electrode GST of the storage transistor ST, is insulated from a trench filling PF made of polycrystalline silicon by means of an intermediate oxide ZOX on the inside of the trench. The n+-type doped drain region D is connected to the supply voltage line V and the n+-type doped common source region S is connected to a bit line BL.

All the combinations between the junctions 1 to 3 and the transistor embodiments planar/planar, planar/trench, trench/planar and trench/trench can be produced. As representative of this, in FIGS. 1 to 3 the junctions 1 to 3 are shown only together with a planar/planar transistor embodiment and in FIGS. 4 and 5 only the junction 1 (1a, 1b) is shown together with a planar/trench transistor embodiment as well as a trench/trench transistor embodiment.

Figure 6:
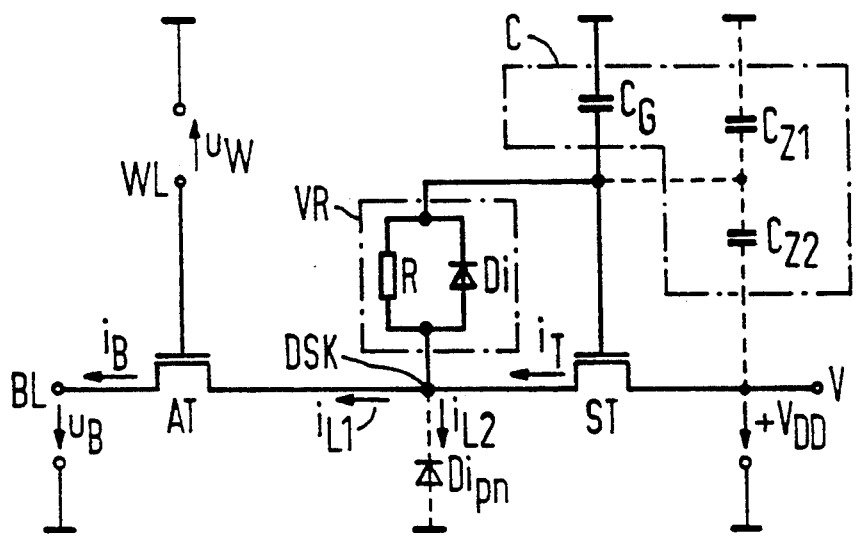
FIG. 6 shows an equivalent circuit diagram of an MOS transistor storage cell of a storage cell arrangement according to the invention.

The equivalent circuit diagram of an MOS transistor storage cell of an arrangement according to the invention with storage cells is illustrated in FIG. 6, the components which act only in a subsidiary or parasitic fashion being characterized by broken lines. A bit line voltage $U_B$ is applied between the reference potential and bit line BL, and the source terminal of the selection transistor AT is connected to a bit line BL so that a bit line current $i_B$ can flow onto the bit line BL. A word line voltage $u_W$ is applied between reference potential and word line WL, and the gate terminal of the selection transistor AT is in an electrically conductive manner connected to a word line WL. The drain terminal of the selection transistor AT has a drain-source node DSK in common with the source terminal of the storage transistor ST, which node DSK is connected to the gate of the storage transistor via a voltage-dependent transistor VR which is itself composed of a resistor R and a diode Di parallel thereto. The gate of the storage transistor ST has a gate capacitance $C_G$ with respect to the reference potential and a voltage $+V_{DD}$ is applied between the supply voltage line V and reference potential.

In addition to the gate capacitor $C_G$, an additional capacitor $C_{Z1}$ which is in parallel with the gate capacitor $C_G$ can be produced by means of the plate P1 shown in FIG. 4. Since in FIG. 4 the substrate NSUB is connected to the supply voltage $V_{DD}$, a further capacitor $C_{Z2}$ in between the supply voltage line V and the gate of the storage transistor ST is also to be allowed for particularly here. The junction between the n-type doped drain-source, region DS and the adjacent p-type doped region PSUB or PG constitutes a parasitic diode $Di_{pn}$ which is poled in the blocking direction and through which a leakage current $i_{L2}$ flows. For the case of a stored "logic 1", it can be ensured that a leakage current $i_{L1}$ flowing to the selection transistor AT corresponds, together with the leakage current $i_{L2}$ which flows through the diode $Di_{pn}$, to the value of a subthreshold current $i_T$ of the storage transistor ST. If this is the case, the capacitor C which is active at the gate of the storage transistor ST cannot discharge via the voltage-dependent resistor VR to the drain-source node DSK and the information "logic 1" is retained for longer. In the case of a stored "logic 0" the working point of the storage transistor ST is in the subthreshold range. The subthreshold current $i_T$ moves the potential of the common drain-source node DSK upwards to a certain extent until equilibrium is produced as a result of higher leakage currents $i_{L1}$ and $i_{L2}$.

Figure 7:
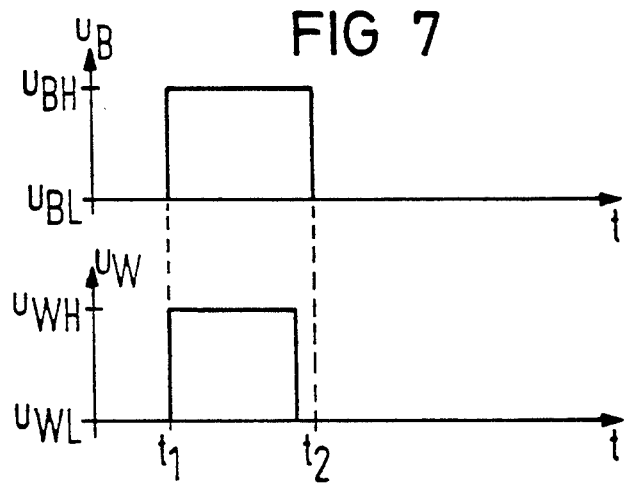
FIG. 7 shows a diagram clarifying the voltage characteristics over time during the writing-in of information into a storage cell arrangement according to the invention.

In order to read in a "logic 1" (high), as shown in FIG. 7, a bit line voltage $u_B$ and a word line voltage $u_W$ [lacuna] which inside a time interval $t_1$ to $t_2$ assume the values $u_{BH}$, $u_{WH}$ (high) and otherwise the values $u_{BL}$, $u_{WL}$ (low). As long as the selection transistor AT is switched on by means of a word line voltage $u_W = u_{WH}$ (high), the applied bit line voltage $u_{BH}$ (high) and also the bit line voltage $u_{BL}$ (low) are read into the MOS transistor storage cell. So that an MOS transistor storage cell, which is written with a "logic 1" (high) is not partially discharged again after the time t2 by a bit line voltage $u_B = u_{BL}$ (low), the selection transistor should already block before the time t2 as a result of a word line voltage $U_W = U_{WL}$ (low). When reading in a "logic 1" (high), the bit line voltage $u_B = u_{BH}$ (high) is present at the drain-source node DSK after the selection transistor AT switches through and charges the capacitor C which acts at the gate of the storage transistor ST up to the bit line voltage $u_B = u_{BH}$ (high) via the voltage-dependent resistor VR which is poled in the direction of flow. The voltage-dependent resistor VR has here a low resistance value of the order of magnitude of several tens of k ohm.

When reading in a "logic 0" (low), the bit line voltage $u_B = u_{BL}$ (low) is also present at the drain-source node DSK after the switching through of the selection transistor AT, which results in a capacitor C which is charged to the voltage $u_{BH}$ and acts on the gate of the storage transistor ST being discharged to $u_{BL}$ with the time constant $T = R^*C$ via the voltage-dependent resistor VR which is poled in the blocking direction. The voltage-dependent resistor VR which is poled in the blocking direction has here the high resistance value R which is in the mega ohm range. Here, the capacitance C is in the region of several fF. For a complete discharging of the capacitor C which acts at the gate of the storage transistor, the selection transistor AT must be switched on for a period of several time constants T.

Figure 8:
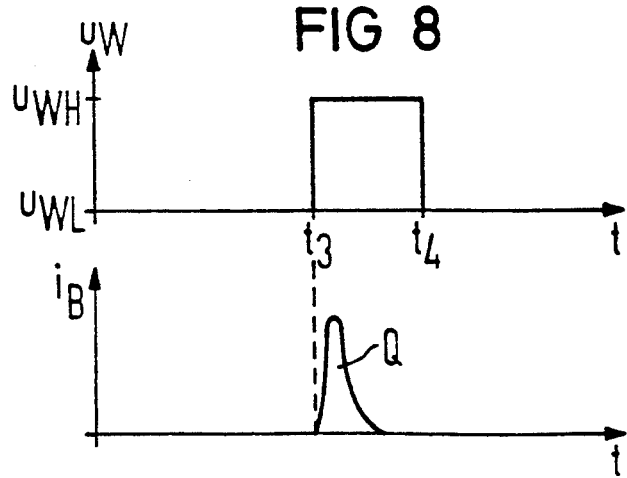
FIG. 8 shows a diagram for clarifying the current and voltage characteristics over time for reading out information from an MOS transistor storage cell of a storage cell arrangement according to the invention.

For reading out, the word line voltage $u_W$ which is shown in FIG. 8 and assumes in a time interval $t_3$ to $t_4$ the value $u_W = u_{WH}$ (high) and otherwise the value $u_W = u_{WL}$ (low) is applied. In the time interval $t_3$ to $t_4$, the selection transistor AT driven by $u_W$ is switched through and as a result the bit line BL is connected to the drain-source node DSK. If the capacitor C acting at the gate of the storage transistor ST is charged to $u_{BH}$ (high) and the bit line voltage $u_B = u_{BL}$ (low), a bit line current $i_B$ also illustrated in FIG. 8 flows onto the bit line BL. The trailing edge of the transient bit line current $i_B$ is essentially determined by the time constant $T = R^*C$ and the time integral of $i_B$ constitutes the quantity Q of charge available when reading out a "logic 1" (high). A transient current flow through the storage transistor ST and thus also a transient bit line current $i_B$ is generated in that the gate potential follows the source potential of the storage transistor with a timing delay and thus a gate-source voltage is produced which is larger than the threshold voltage of the storage transistor ST. The charge Q is composed of the charge of the capacitor C acting at the gate of the storage transistor ST and from the charge which results from the drain current of the storage transistor ST and is larger by several orders of magnitude. If the quantity Q of charge is large enough, with a predetermined bit line capacitance a voltage pulse on the bit line BL can be detected as "logic 1".

If the arrangement according to the invention with MOS transistor storage cells is given a scaling towards smaller cell geometries, the channel width and the channel length are reduced approximately to the same degree, this brings about a largely unchanged drain current through the storage transistor. The time constant $T = R^*C$ also remains largely unchanged since the resistance R increases approximately to the same degree as the capacitance C decreases. Due to the, to a large extent, constancy of the drain current and of the time constant T the available quantity Q of charge is also largely scale-independent.

In the above embodiments, the bit line voltage $u_B = u_{BH}$ (high) corresponds to a "logic 1"; correspondingly, the bit line voltage $u_B = u_{BL}$ (low) could also be assigned to a "logic 1".

The arrangement according to the invention cannot only, as shown, be constructed using n-type channel technology but also using p-channel technology. For this purpose, in all the doping regions the line types are to be switched over from p to n and vice versa and the signs of the voltages are to be changed.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. An arrangement with self-amplifying dynamic MOS transistor storage cells comprising: a multiplicity of MOS transistor storage cells which each have one selection transistor whose gate terminal is electrically connected to a word line and which each have one storage transistor whose gate terminal is connected to ground via a capacitor, wherein both the selection transistor and the storage transistor are MOS transistors, wherein a second terminal of each of the selection transistors is electrically connected to a bit line, wherein a third terminal of each of the selection transistors and a second terminal of each of the storage transistors form a common drain-source node, the third terminals of each of the storage transistors are electrically connected to a supply voltage; and wherein one voltage-dependent resistor connects the common drain-source node to the gate terminal of each of the storage transistors and the capacitor wherein the voltage-dependent resistor has a low resistance value during charging and a high resistance value during discharging of the capacitor.

2. The arrangement with self-amplifying dynamic MOS transistor storage cells as claimed in claim 1, wherein each of the voltage-dependent resistors is formed by the gate electrode of the storage transistor and the common drain-source region of the two transistors being composed of semiconductor materials of the same conductivity type, the gate electrode of the storage transistor having a higher doping concentration than the drain-source region.

3. The arrangement with self-amplifying dynamic MOS transistor storage cells as claimed in claim 1, wherein the gate electrodes of the storage transistors and the common drain-source regions of the two transistors are composed of semiconductor materials are composed of semiconductor materials of the same conductance type, the gate electrodes of the storage transistors having a higher doping concentration than the common drain-source region, and wherein a metallic layer forms together with the gate electrode of the storage transistor to form a Schottky diode which has a lower resistance during the charging of the capacitor than during the discharging of the capacitor.

4. The arrangement with self-amplifying dynamic MOS transistor storage cells as claimed in claim 1, wherein the gate electrodes of the storage transistors and the common drain-source regions of the two transistors are composed of highly doped semiconductor materials of the same conductance type, wherein a highly doped region of a conductance type which is different from the gate electrode and a drain-source region is between the gate electrode and the drain-source region in order to produce a voltage-dependent resistor which has a lower resistance during the charging of the capacitor than during the discharging of the capacitor.

5. The arrangement with self-amplifying dynamic MOS transistor storage cells as claimed in claim 1, wherein the selection transistors are of planar construction.

6. The arrangement with self-amplifying dynamic MOS transistor storage cells as claimed in claim 1 wherein each of the storage transistors is of planar construction and each of the storage transistors is located in a trench and wherein the supply voltage is directly connected to a substrate of the arrangement.

7. The arrangement with self-amplifying dynamic MOS transistor storage cells as claimed in claim 1, wherein the selection transistors and the storage transistors are located in a same trench, the gate electrode of the storage transistor being insulated from a gate electrode of the selection transistor by an intermediate oxide.

* * * * *